(12) United States Patent
Wojtczak et al.

(10) Patent No.: US 6,527,819 B2
(45) Date of Patent: *Mar. 4, 2003

(54) POLISHING SLURRIES FOR COPPER AND ASSOCIATED MATERIALS

(75) Inventors: William A. Wojtczak, Austin, TX (US); Thomas H. Baum, New Fairfield, CT (US); Long Nguyen, San Jose, CA (US); Cary Regulski, Sugarhill, GA (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 10/022,308

(22) Filed: Dec. 18, 2001

(65) Prior Publication Data

US 2002/0124474 A1 Sep. 12, 2002

Related U.S. Application Data

(63) Continuation-in-part of application No. 09/562,298, filed on May 1, 2000, now Pat. No. 6,409,781.

(51) Int. Cl.$^7$ .............................. C09G 1/02; C09G 1/04; B24B 1/00

(52) U.S. Cl. .............................. 51/308; 51/307; 51/309; 106/3; 438/692; 438/693; 252/79.1; 252/79.2; 252/79.5; 216/89; 216/99; 216/101; 216/105; 216/106

(58) Field of Search .......................... 51/307, 308, 309; 106/3; 252/79.1, 79.2, 79.5; 216/89, 99, 101, 105, 106; 438/692, 693

(56) References Cited

U.S. PATENT DOCUMENTS

| | | | |
|---|---|---|---|
| 5,340,370 A | 8/1994 | Cadien | |
| 5,756,398 A | 5/1998 | Wang et al. | |
| 5,800,577 A | 9/1998 | Kido | |
| 5,858,813 A | 1/1999 | Scherber et al. | |
| 5,980,775 A | 11/1999 | Grumbine et al. | |
| 5,985,748 A | 11/1999 | Watts et al. | |
| 5,993,685 A | 11/1999 | Currie et al. | |
| 6,001,730 A | 12/1999 | Farkas et al. | |
| 6,045,435 A | 4/2000 | Baja et al. | |
| 6,063,306 A | 5/2000 | Kaufman et al. | |
| 6,083,840 A | 7/2000 | Mravic et al. | |

FOREIGN PATENT DOCUMENTS

JP 8-223072 8/1996

*Primary Examiner*—Michael Marcheschi
(74) *Attorney, Agent, or Firm*—Margaret Chappuis

(57) ABSTRACT

A chemical mechanical polishing slurry and method for using the slurry for polishing copper, barrier material and dielectric material that comprises a first and second slurry. The first slurry has a high removal rate on copper and a low removal rate on barrier material. The second slurry has a high removal rate on barrier material and a low removal rate on copper and dielectric material. The first and second slurries at least comprise silica particles, an oxidizing agent, a corrosion inhibitor, and a cleaning agent.

40 Claims, 7 Drawing Sheets

POLISHING SLURRIES FOR COPPER AND ASSOCIATED MATERIALS

This is a continuation in part of U.S. patent application Ser. No. 09/562,298 filed May 1, 2000, U.S. Pat. No. 6,409,787 in the names of Thomas H. Baum, Long Hoanghuan, Cary Regulski, and William Alan, for "Polishing Slurries for Copper and Associated Materials."

BACKGROUND OF THE INVENTION

The present invention relates to a chemical mechanical polishing slurry for surfaces of a semiconductor wafer, and more particularly, to a chemical mechanical polishing slurry and a method for using the slurry to remove and polish copper, barrier materials and dielectric materials layered on semiconductor wafer surfaces.

Semiconductor wafers are used to form integrated circuits. The semiconductor wafer typically includes a substrate, such as silicon, upon which dielectric materials, barrier materials, and metal conductors and interconnects are layered. These different materials have insulating, conductive or semi-conductive properties. Integrated circuits are formed by patterning regions into the substrate and depositing thereon multiple layers of dielectric material, barrier material, and metals.

In order to obtain the correct patterning, excess material used to form the layers on the substrate must be removed. Further, to obtain efficient circuits, it is important to have a flat or planar semiconductor wafer surface. Thus, it is necessary to polish certain surfaces of a semiconductor wafer.

Chemical Mechanical Polishing or Planarization ("CMP") is a process in which material is removed from a surface of a semiconductor wafer, and the surface is polished (planarized) by coupling a physical process such as abrasion with a chemical process such as oxidation or chelation. In its most rudimentary form, CMP involves applying slurry, a solution of an abrasive and an active chemistry, to a polishing pad that buffs the surface of a semiconductor wafer to achieve the removal, planarization, and polishing process. It is not desirable for the removal or polishing process to be comprised of purely physical or purely chemical action, but rather the synergistic combination of both in order to achieve fast uniform removal. In the fabrication of integrated circuits, the CMP slurry should also be able to preferentially remove films that comprise complex layers of metals and other materials so that highly planar surfaces can be produced for subsequent photolithography, or patterning, etching and thin-film processing.

Recently, copper has been used as the metal interconnect for semiconductor wafers. Typically for copper technology, the layers that are removed and polished consist of a copper layer (about 1–1.5 $\mu$m thick) on top of a thin copper seed layer (about 0.05–0.15 $\mu$m thick). These copper layers are separated from the dielectric material surface by a layer of barrier material (about 50–300 Å thick). The key to obtaining good uniformity across the wafer surface after polishing is by using a slurry that has the correct removal selectivities for each material. If appropriate material removal selectivity is not maintained, unwanted dishing of copper and/or erosion of the dielectric material may occur.

Dishing occurs when too much copper is removed such that the copper surface is recessed relative to the dielectric surface of the semiconductor wafer. Dishing primarily occurs when the copper and barrier material removal rates are disparate. Oxide erosion occurs when too much dielectric material is removed and channels are formed in the dielectric material on the surface of the semiconductor wafer relative to the surrounding regions. Oxide erosion occurs when the dielectric material removal rate is locally much higher than the copper removal rate. Dishing and oxide erosion are area dependent being wafer pattern and pitch dependent as well.

Typical commercial CMP slurries used to remove overfill material and polish semiconductor wafer surfaces have a barrier material removal rate below 500 Å/min. Further, these slurries have a copper to barrier material removal rate selectivity of greater than 4:1. This disparity in removal rates during the removal and polishing of the barrier material results in significant dishing of copper on the surface of the semiconductor wafer and/or poor removal of the barrier material.

Another problem with conventional CMP slurries is that the removal chemistry of the slurry is compositionally unstable. Further, many of the colloidal abrasives agglomerate after relatively short time frames following addition to the supporting chemistry. Both of these problems lead to significant operational obstacles.

A further problem in commercial CMP slurries is that the abrasive materials in the slurries produce defects in the form of micro scratches. These slurries also have poor planarization efficiency, which is the ability of the slurry to polish high points preferentially over low points on the surface of the wafer. Micro scratches and poor planarization efficiency result in integrated circuits with increased defects and a lower yield.

Still another problem of commercial CMP slurries is that the chemicals that make up the slurries produce a copper surface that has a high corrosion tendency post polish.

An object of this invention, therefore, is a CMP slurry that employs a two-step slurry approach. The slurry used in the first step has a high copper removal rate and a comparatively low barrier material removal rate. The slurry used in the second step has a relatively high barrier material removal rate, comparable removal rate for copper and low removal rate on the dielectric material. By using this two-step slurry approach, the first and second slurries can provide the appropriate selectivity ranges to minimize copper dishing and oxide erosion, thereby providing a viable CMP approach to advanced device manufacturing.

Another object of the invention is for the first and second slurries to have stable removal chemistry.

Yet another object is to use abrasives in the first slurry that achieve high copper removal rates, but minimal barrier material removal rates, and to use abrasives in the second slurry that provide superior removal rates on barrier material and low removal rates for copper, which also minimize micro scratch defects and provide very good planarization efficiency.

It is a further object of this invention to employ active copper cleaning chemistry and corrosion inhibitors in the slurry to minimize copper corrosion post polish, and to eliminate post-polish cleaning steps.

These and other objects and advantages of the invention will be apparent to those skilled in the art upon reading the following detailed description and upon reference to the drawings.

SUMMARY OF THE INVENTION

The present invention is directed to a chemical mechanical polishing slurry comprising a first slurry, which has a high removal rate on copper and a low removal rate on barrier material and a second slurry, which has a high removal rate on barrier material and a low to comparable removal rate on copper and the associated dielectric material. The first and second slurries comprise silica particles, an oxidizing agent, a corrosion inhibitor, and a cleaning agent. Also disclosed as the present invention is a method for chemical mechanical polishing copper, barrier material and dielectric material with the polishing slurry of the present invention. As will become apparent from the discussion that follows, the stable slurry and method of using the slurry provide for removal of material and polishing of semiconductor wafer surfaces with significantly no dishing or oxide erosion, with significantly no surface defects and good planarization efficiency, and produce a copper surface with minimal corrosion tendency post-polish.

DETAILED DESCRIPTION OF THE INVENTION

Figure 1:
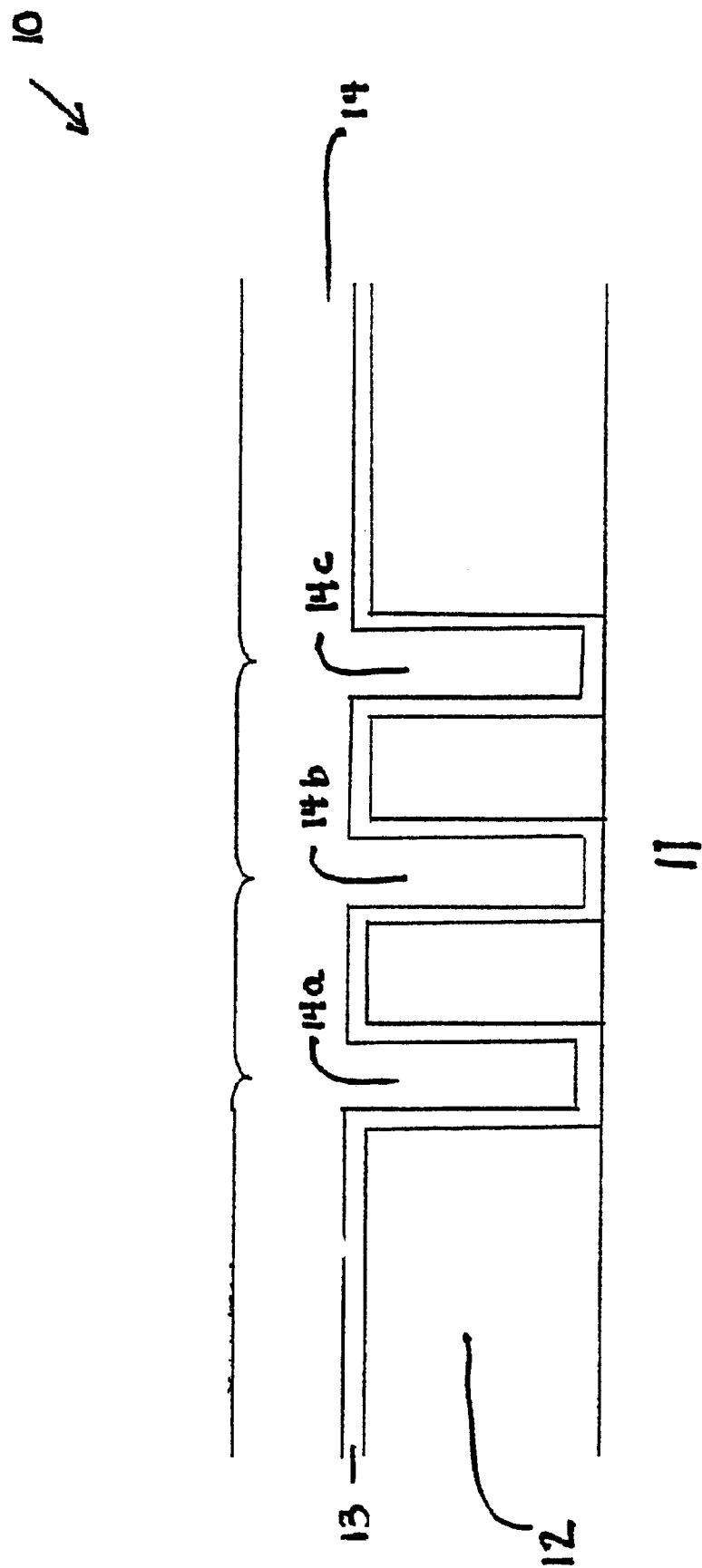
FIG. 1 is a cross-sectional view of a semiconductor wafer prior to chemical mechanical polishing.

FIG. 1 illustrates a semiconductor wafer 10 prior to CMP. As shown, substrate 11 may be made of any conventional semiconductor materials, including silicon or germanium or silicon-germanium. Layered on top of the substrate 11 is dielectric material 12, which is preferentially silicon oxide, low k dielectrics comprised substantially of silicon oxide or a carbon containing silicon oxide. The instant invention is not limited to such dielectric materials and is also useful for removal of dielectrics such as fluoride doped silicon glass (FSG). Layered on the dielectric material 12, is barrier material 13. The barrier material layer 13 is typically about 50 to 300 Å thick. The barrier material 13 may be any material conventionally used, but is typically chosen from the group of tungsten nitride, tantalum, tantalum nitride, titanium nitride, silicon doped tantalum nitride or silicon doped titanium nitride. Finally, a layer of copper 14 covers the barrier material layer 13, and extends into trenches 14a, 14b, and 14c. The copper layer 14 is usually about 0.1–0.15 µm thick and the copper layer 14 in FIG. 1 includes a thin copper seed layer, which is usually about 0.05–0.15 µm thick.

Figure 2:
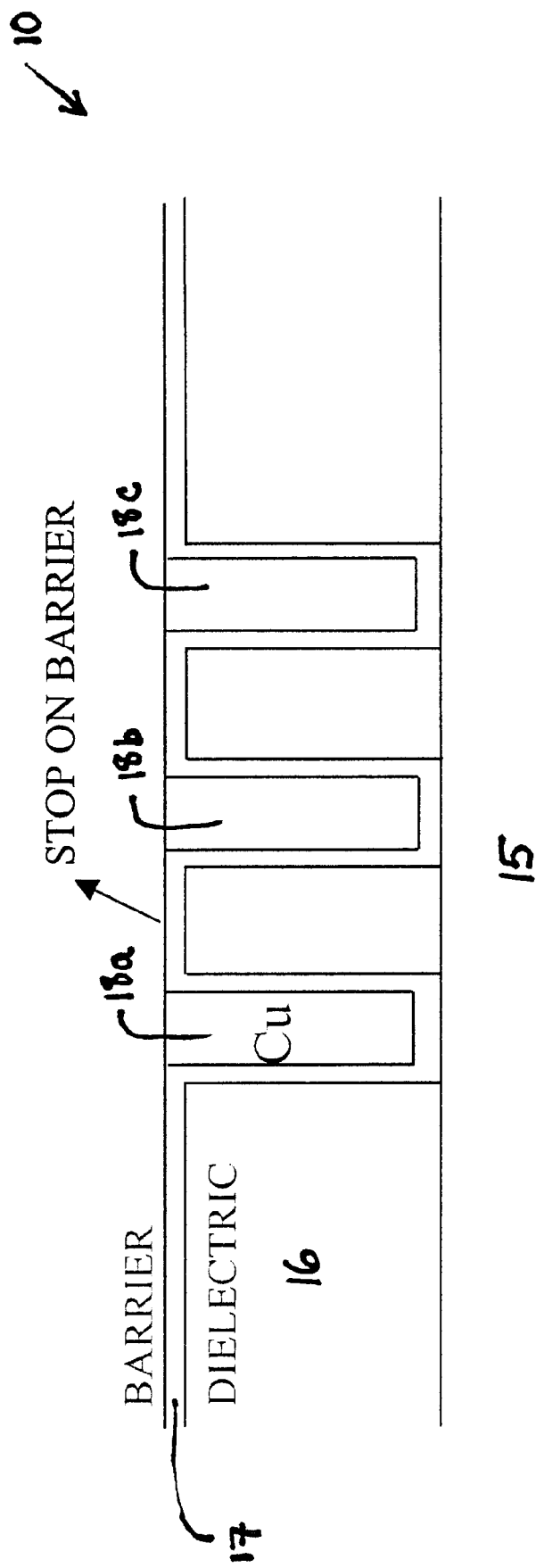
FIG. 2 is a cross sectional view of the semiconductor wafer of FIG. 1 following chemical mechanical polishing with the first slurry, according to the present invention.
Figure 3:
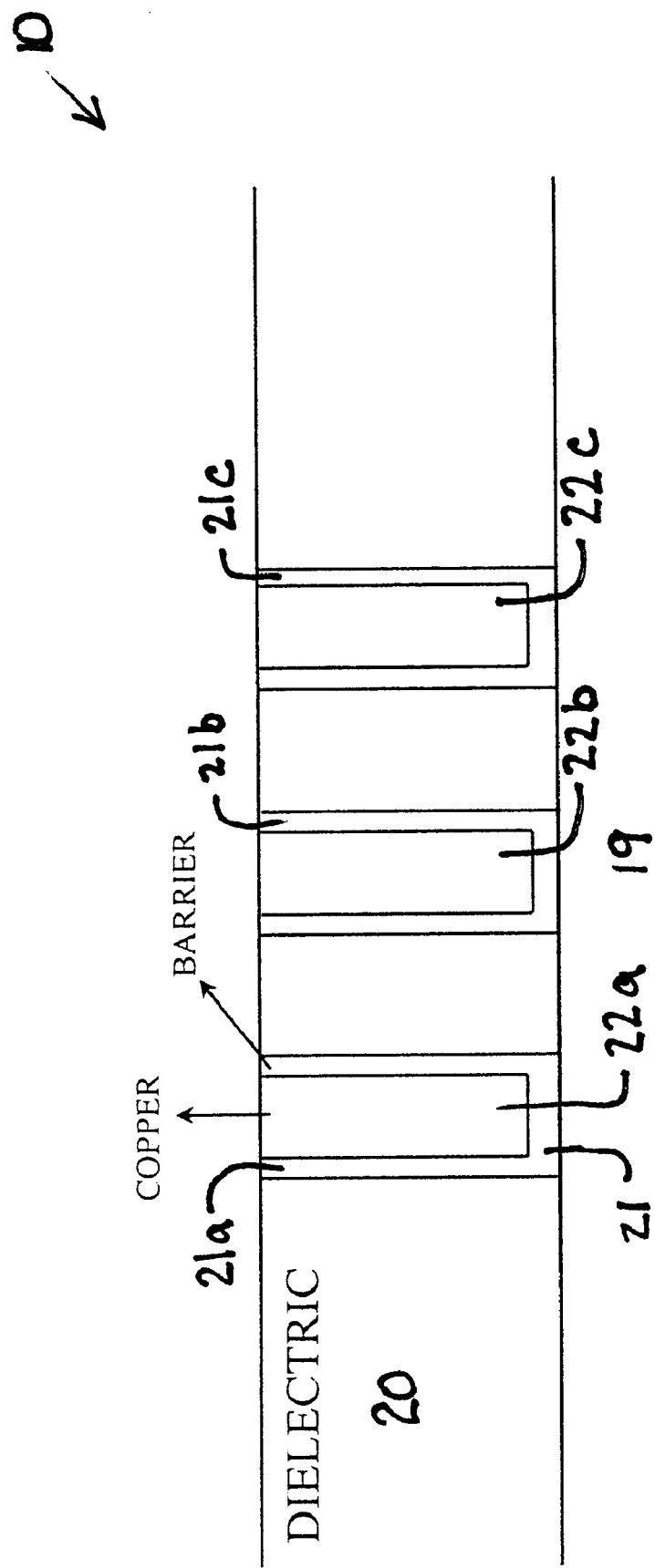
FIG. 3 is a cross sectional view of the semiconductor wafer of FIG. 2 following chemical mechanical polishing with the second slurry, according to the present invention.

The invention is a CMP slurry designed to polish copper 14 and associated barrier materials 13 such as tungsten nitride, tantalum, tantalum nitride, silicon doped tantalum nitride, titanium nitride and silicon doped titanium nitride. The chemical mechanical polishing slurry of the present invention is comprised of two parts. The first slurry is a copper selective slurry used to remove the bulk copper down to the barrier layer (FIG. 2). The first slurry has a high removal rate of copper and a low removal rate of barrier material. The second slurry is selective to the barrier layer and removes the barrier material down to the dielectric material. The barrier and copper rate are comparable or the barrier removal is greater than copper for this step (FIG. 3). The various removal rates of the first and second slurries on various materials are shown in Table 1. In this way, two slurries together comprise a combined package to polish copper metallization schemes for integrated circuit manufacturing.

TABLE 1

Removal Rates of the First and Second Slurries on Different Materials*

| LAYER | First Slurry Removal Rates (Å/min) | Second Slurry Removal Rates (Å/min) | Selectivity Material: Cu First Slurry | Selectivity Material: Cu Second Slurry |
|---|---|---|---|---|
| Copper | >5000 | <1000 | | |
| Tantalum | <500 | >1000 | 1:10 | 1:1 |
| Tantalum Nitride | <500 | >1000 | 1:10 | 1:1 |
| Thermal Oxide | <150 | <150 | 1:50 | 1:6 |

*(Down Force = 5 psi, Flow Rate = 200 mL/min, Table Speed = 90 rpm, Quill Speed = 50 rpm, Pad Type = IC 1000)

In one embodiment, the first step slurry removes copper material at a higher rate than barrier material. Preferably the copper material removal rate is greater than 3000 Å/min, more preferably greater than 4000 Å/min and most preferably greater than 5000 Å/min; and the barrier material removal rate is less than 600 Å/min and more preferably less than 50 Å/min. The second step slurry removes barrier material at a rate of at least 500 Å/min, more preferably at least 750 Å/min and most preferably at least 1000 Å/min, having a barrier material to dielectric material selectivity of from about 5:1, more preferably from about 7:1 and most preferably from about 15:1.

Referring to FIG. 1, the present invention includes a method for chemical mechanical polishing copper 14, barrier material 13 and dielectric material 12, comprises the following steps: (1) providing a first chemical mechanical polishing slurry that has a high removal rate on copper 14 and a low removal rate on barrier material 13; (2) chemical mechanical polishing a semiconductor wafer surface 10 with the first slurry; (3) providing a second chemical mechanical polishing slurry that has a high removal rate on barrier material 13 a comparable removal rate on copper 14 and a low removal rate on the dielectric material 12; and (4) chemical mechanical polishing the semiconductor wafer surface 10 with the second slurry.

Generally, the slurry is applied to a pad contained on a polishing instrument. Polishing instrument parameters such as down force (DF), flow rate (FR), table speed (TS), quill speed (QS), and pad type can be adjusted to effect the results of the CMP slurry. These parameters are important in obtaining efficient planarization results and limiting dishing and erosion. Although these parameters may be altered, when used with the CMP slurry of the present invention, the standard conditions used are DF of 5psi, FR of 200 mL/min, TS of 90 rpm, QS of 50 rpm, and the IC 1000 pad type.

FIG. 2 illustrates the semiconductor wafer 10 of FIG. 1, after steps (1) and (2) of the present method for CMP have been carried out, and the semiconductor wafer surface has been polished with the first slurry. When FIG. 2 is compared to FIG. 1, the top copper layer 14 in FIG. 1 has been preferentially removed, and only the copper in the trenches (FIG. 2) 18a, 18b, and 18c is left. As shown in FIG. 2 the barrier material layer 17 is substantially in tact, and the dielectric material 16 based on substrate 15 is still unexposed.

Similarly, FIG. 3 illustrates the semiconductor wafer 10 of FIGS. 1 and 2, after steps (3) and (4) of the present method for CMP have been carried out, and the semiconductor wafer surface has been polished with the second slurry. As shown in FIG. 3, the barrier material layer 21 has been removed down to the dielectric material 20. The second slurry also removed just enough of the copper in trenches 22a, 22b, and 22c so that the surface of the semiconductor wafer 10 is flat and planar. The second slurry also serves to polish the newly exposed surface, including the dielectric material 20, the barrier material 21a, 21b, 21c, and the copper 22a, 22b, 22c. All of these materials are based on substrate 19.

Figure 4:
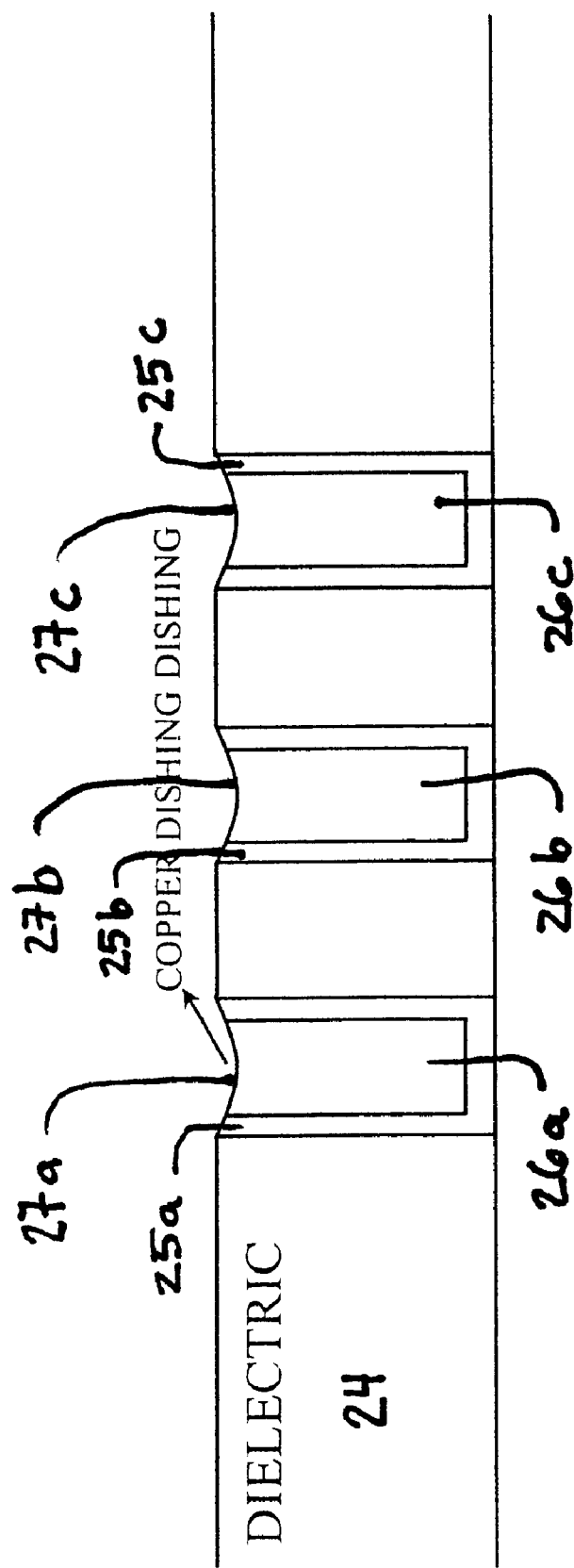
FIG. 4 is a cross sectional view of a semiconductor wafer illustrating copper dishing.

By using the first and second slurries of the claimed invention, with the selectivities described in Table 1, and following the described method, copper dishing (FIG. 4) and oxide erosion (FIG. 5) can be minimized. FIG. 4 shows a semiconductor wafer to which a CMP slurry has been applied, which had a higher selectivity for copper 26a, 26b, 26c than for the barrier material 25a, 25b, 25c or dielectric material 24. As a result, disparate amounts of copper are removed from the surface of the semiconductor wafer. This is known as copper dishing and is shown by the dish-like troughs 27a, 27b, and 27c in the trenches of copper 26a, 26b, 26c. The CMP slurry of the present invention and method of using this slurry greatly reduces copper dishing.

Figure 5:
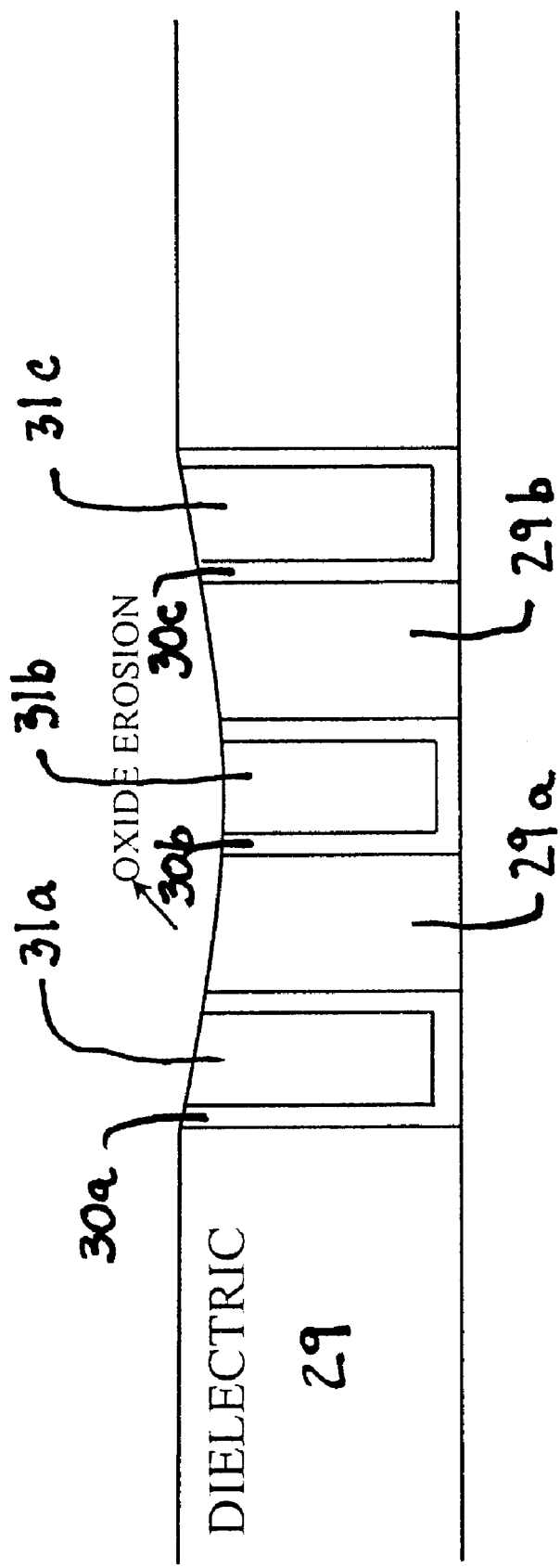
FIG. 5 is a cross sectional view of a semiconductor wafer illustrating oxide erosion.

Similarly, FIG. 5 shows a semiconductor wafer to which a CMP slurry has been applied, which has a higher selectivity for the dielectric material 29 than for the barrier material 30a, 30b, 30c, or copper 31a, 31b, 31c. As a result, disparate amounts of dielectric material are removed from the surface of the semiconductor wafer. This is known as oxide erosion and is shown by the indentions and/or reduction of the dielectric material 29a, 29b. The CMP slurry of the present invention and method of using this slurry greatly reduces oxide erosion.

Turning now to the composition of the CMP slurry, generally the first and second slurries comprise silica particles, an oxidizing agent, a corrosion inhibitor, and a cleaning agent. Preferably, the CMP compositions comprise a first slurry comprising from about:

| weight % | |
|---|---|
| 1–10% | fumed or colloidal silica particles |
| 1–12% | oxidizing agent; |
| 0–2% | corrosion inhibitor; | and a second slurry comprising from about:

| weight % | |
|---|---|
| 1–10% | fumed or colloidal silica particles; |
| 0.1–1.0% | oxidizing agent; and |
| 0–2% | corrosion inhibitor. |

The chemistry of the first and second slurries should be stable and have a pH in the range of about 2 to 5. The first and second slurries may contain potassium or ammonium hydroxide in such amounts to adjust the pH to a range of about 2 to 5.

The preferred oxidizing agent for the first and second slurries is potassium iodate formed by reaction of $HIO_3$ with KOH. The corrosion inhibitor and cleaning agent for the first and second slurries should be a carboxylic acid. More specifically, the carboxylic acid may be chosen from the group of glycine, oxalic acid, malonic acid, succinic acid and nitrilotriacetic acid. Alternatively, the carboxylic acid may be a dicarboxylic acid that preferentially has a nitrogen containing functional group. In the most preferred form, the corrosion inhibitor and cleaning agent for the first and second slurries is iminodiacetic acid. Inorganic acids such as phosphoric, nitric and hydrochloric were added to adjust pH and accelerate copper removal rates.

The use of potassium iodate as the oxidizing agent and carboxylic acids as the corrosion inhibitors and cleaning agents and inorganic acids as accelerating agents creates a stable removal chemistry in the pH region of about 2 to 5, for the first and second slurries. Further, the use of copper corrosion inhibitors and cleaning agents minimizes copper corrosion, as indicated by low static etch rates of roughly less than 50 Å/min on copper.

The silica particles of the first and second slurries can be precipitated. The precipitated particles usually range from about 3 to 100 nm in size and can be spherical. An alternative to precipitated silica particles in the first slurry is fumed silica. Generally, the fumed silica has a mean particle size of less than 700 nm.

Alternatively, and more preferred is to use colloidal silica particles of the type described. The colloidal silica particles can range from about 3 to 100 nm in size, and can be spherical. Preferentially, when the first and second slurries employ spherical colloidal particles, the particles should have a narrow size distribution. More specifically, about 99.9% of the spherical colloidal particles should be within about 3 sigma of a mean particle size with negligible particles larger than about 500 nm.

The first slurry, thus, can employ either precipitated spherical silica particles in the size range of 3 to 100 nm, or fumed silica with mean particle size less than about 700 nm. These particles coupled with the iodate chemistry allows the first slurry to achieve high copper removal rate but minimal barrier material removal rate. Colloidal silica, with a narrow size distribution, minimizes micro scratch defects and provides superior removal rates on barrier materials, greater than about 1000 Å/min, and low removal rates for copper for the second slurry. Further, spherical silica abrasives with a mean size of less than about 100 nm provide very good planarization efficiency.

The pH, oxidizing agents, modifying agents, abrasive particle composition and size distribution, and weight percent were evaluated to establish a baseline for removal rates and selectivity.

EXAMPLE 1

Precipitated silica mean particle sizes of 8 nm, 20 nm, and 70 nm were tested. The fumed silica particle size tested was less than 700 nm. The optimum CMP slurry, including the first and second slurry, had a precipitated silica mean size of less than about 100 nm. The optimum fumed silica abrasive mean size for the first slurry is less than about 700 nm. The optimum CMP slurry formulations contain 1–10% precipitated silica, or fumed silica for the first slurry.

Figure 6:
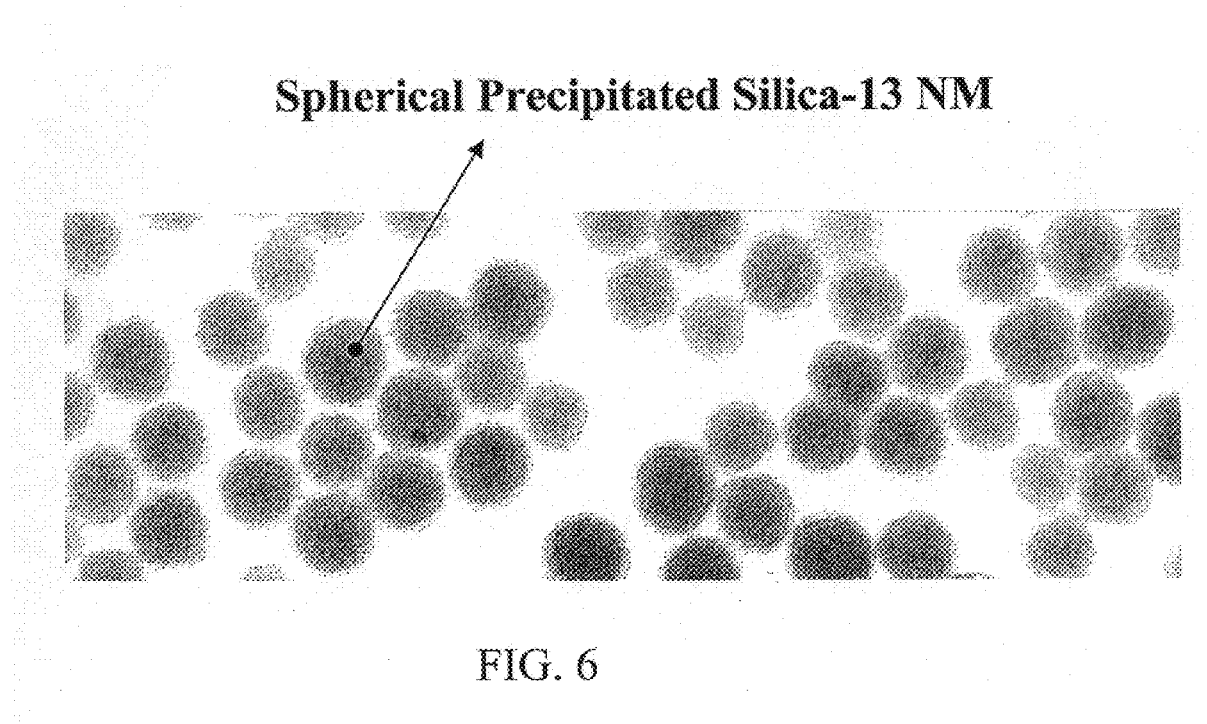
FIG. 6 is a transmission electron micrograph (TEM) showing 13 nm silica particles of the present invention.
Figure 7:
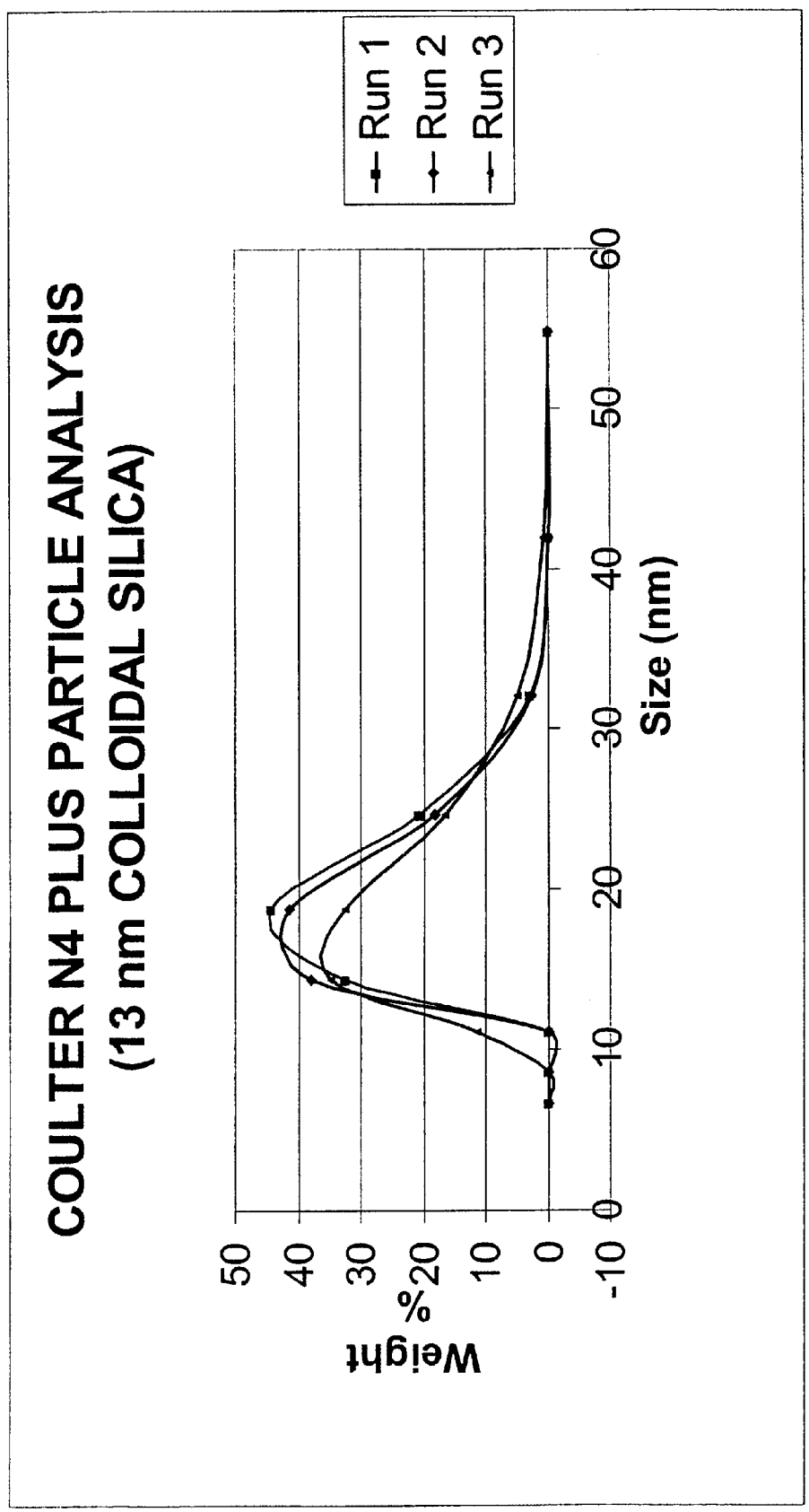
FIG. 7 is the size distribution of 13 nm silica particles of the present invention determined with Coulter N4 Plus particle analyzer.

Further, different types of abrasive particles were studied to maximize the removal and selectivity characteristic of the slurry. Precipitated silica abrasives, with mean size distributions of 4 nm, 8 nm, 13 nm, 20 nm and 70 nm were tested. FIG. 6 shows a TEM picture of 13 nm slurry. The size distribution of these particles is presented in FIG. 7. Fumed silica, with a mean particle size of less than about 700 nm, was also evaluated. All of these mean size distributions can be used to achieve effective polishing rates and selectivities for the first and second slurries.

EXAMPLE 2

Different pH ranges were tested for the first and second slurries (See Table 2 and 3). The precipitated silica abrasives had a starting pH range of 9–11 and the fumed silica had a starting pH range of 2–7. The optimum CMP slurry was found to be acidic. Thus, the pH ranges were altered to the 2 to 5 range by adding potassium, sodium or ammonium hydroxide in appropriate amounts to solutions of iodic acid, cleaning agent and corrosion inhibitor.

EXAMPLE 3

Several formulations of the first slurries were prepared. The characteristics of these formulations are described in Table 2. The first slurry is optimally comprised of formula 5, for colloidal silica particles, and formula 19 for fumed silica particles. Thus, the first slurry is preferentially comprised of 1–10% colloidal silica with particle size 3 to 100 nm, or 1–5% fumed silica with mean particle size of less than about 700 nm. Further, the active chemistry for the optimum first slurry is about 1–12% potassium iodate ($KIO_3$, formed by reaction of $HIO_3$ with KOH), which is used as the oxidizing agent for the copper, about 0–5% concentrated inorganic acid as a copper activating agent, and 0–2% iminodiacetic acid (IDA) as the copper corrosion inhibitor and cleaning agent.

TABLE 2

Formulations for the First Slurry

| Formula | Oxidizer, % | Copper Inhibitor, % | Copper Activator, % | Neutralizer, % | Abrasive, % | pH | Thermal Oxide RR* | Copper RR* | Tantalum RR | Tantalum Nitride RR |
|---|---|---|---|---|---|---|---|---|---|---|
| 1 | $HIO_3$, 8.22 | IDA, 1.5 | $H_3PO_4$ 1.764 | KOH 4.523; NH4OH, 3.7768 | Colloidal (13 nm), | 2.4 | — | 3176 | — | — |
| 2 | $HIO_3$, 12.33 | IDA, 1.5 | $H_3PO_4$ 0.5 | KOH, 5.022 | Colloidal (13 nm)k 1 | 2.7 | 113 | 4713 | — | — |
| 3 | $HIO_3$, 10 | IDA, 1.5 | — | NH4OH, 2.685 | Colloidal (13 nm), 1 | 3.0 | 126 | 4800 | — | — |
| 4 | $HIO_3$, 10 | IDA, 1.5 | — | KOH, 4.084 | Colloidal (13 nm), 1 | 2.8 | 126 | 5165 | — | — |
| 5! | $HIO_3$, 10 | IDA, 1.5 | $H_3PO_4$, 0.5 | KOH, 4.523 | Colloidal (13 nm), 1 | 2.9 | 151 | 6530 | 453 | 590 |
| 6 | $HIO_3$, 12.33 | IDA, 1.5 | $H_3PO_4$, 0.5 | KOH, 5.486 | Colloidal (13 nm), 1 | 3.1 | 115 | 6877 | 422 | 528 |
| 7 | $HIO_3$, 12.33 | IDA, 1.5 | $H_3PO_4$, 0.5 | KOH, 5.486 | Colloidal (13 nm), 1 | 3.1 | 115 | 6877 | 422 | 528 |
| 8 | $HIO_3$, 8.22 | IDA, 1.5 | $H_3PO_4$, 0.5 | KOH, 3.978 | Colloidal (13 nm), 1 | 3.1 | 112 | 4797 | 494 | 730 |
| 9 | $HIO_3$, 8.22 | — | HCl, 0.15 g | KOH, 4.284 | Colloidal (13 nm), 1 | 6.0 | 117 | 423 | 878 | 1031 |
| 10 | $HIO_3$, 4.11 | IDA, 1.5 | $H_3PO_4$, 0.5 | KOH, 2.92 | Colloidal (13 nm), 1 | 3.4 | 134 | 2138 | 550 | 618 |
| 11 | $HIO_3$, 4.11 | IDA, 1.5 | $H_3PO_4$, 0.5 | KOH, 2.92 | Colloidal (13 nm), 1 | 3.6 | 105 | 2134 | 512 | 882 |
| 12 | $HIO_3$, 6.17 | IDA, 1.5 | $H_3PO_4$, 0.5 | KOH, 4.087 | Colloidal (13 nm), | 6.0 | 106 | 1448 | 890 | 1047 |
| 13 | $HIO_3$, 4.11 | IDA, 1.5 | $H_3PO_4$, 0.5 | KOH, 2.918 | Colloidal (13 nm), 1 | 3.5 | 140 | 3900 | 720 | 1066 |
| 14 | $HIO_3$, 4.11 | IDA, 1.5 | $H_3PO_4$, 0.5 | KOH, 3.012 | Colloidal (8 nm), 1 | 3.6 | 45 | 4157 | 527 | 623 |
| 15 | $HIO_3$, 4.11 | IDA, 1.5 | $H_3PO_4$, 0.5 | KOH, 3.067 | Colloidal (20 nm), 1 | 3.7 | 172 | 6852 | 649 | 842 |
| 16 | $HIO_3$, 4.11 | IDA, 1.5 | $H_3PO_4$, 0.5 | KOH, 3.13 | Colloidal (70 nm), 1 | 3.6 | 171 | 2720 | 451 | 625 |

TABLE 2-continued

Formulations for the First Slurry

| Formula | Oxidizer, % | Copper Inhibitor, % | Copper Activator, % | Neutralizer, % | Abrasive, % | pH | Thermal Oxide RR* | Copper RR* | Tantalum RR | Tantalum Nitride RR |
|---|---|---|---|---|---|---|---|---|---|---|
| 17 | $HIO_3$, 4.11 | IDA, 1.5 | $H_3PO_4$, 0.5 | KOH, 2.918 | Colloidal (13 nm), 1 | 3.6 | 118 | 3973 | 832 | 1028 |
| 18 | $HIO_3$, 4.11 | IDA, 1.5 | — | KOH, 2.474 | Colloidal (13 nm), 1 | 3.5 | 167 | 5630 | 728 | 946 |
| 19! | $HIO_3$, 4.11 | IDA, 1.5 | $H_3PO_4$, 0.5 | KOH, 2.918 | fumed, 1 | 3.6 | 15 | 4823 | 2.4 | −10 |

*"RR" means removal rates in Å/min.
Stock Solutions:
$HIO_3$ (50% by weight);
$H_3PO_4$ (85.87% by weight);
KOH (45–46% by weight);
$NH_4OH$ (28–30% by weight);
$HNO_3$ (68–70% by weight);
HCl (36–38% by weight)

As can be seen from Table 2, all of the first slurry formulations of the present invention were effective in achieving acceptable copper removal rates, and semiconductor wafer surfaces of high quality. Thus, the first slurry is preferentially comprised of 1–10% colloidal silica with particle size of less than about 100 nm.

EXAMPLE 4

Several formulations of the second slurry were prepared. The characteristics of these formulations are described in Table 3. The second step slurry is dependent on the copper removal rate requirement and therefore is optimally comprised of either formula 6 or 9. The active chemistry for the optimum second slurry is 0.1–1% potassium iodate ($KIO_3$, formed by reaction of $HIO_3$ with KOH) as the oxidizing agent for the copper, 0–5% concentrated inorganic acid and 0–2% iminodiacetic acid as the copper corrosion inhibitor and cleaning agent. Table 3. Formulations for the Second Slurry

| Formula | Oxidizer, % | Copper Inhibitor, % | Copper Activator, % | Neutralizer, % | Abrasive, % | pH | Thermal Oxide RR* | Copper RR* | Tantalum RR | Tantalum Nitride RR |
|---|---|---|---|---|---|---|---|---|---|---|
| 1 | $HIO_3$, 0.1 | IDA, 1.5 | — | KOH 1.005 | Colloidal (13 nm), 1 | 3.4 | 101 | 430 | 462 | 2128 |
| 2 | $HIO_3$, 0.1 | IDA, 1.5 | $HNO_3$, 10 | KOH 13.66 | Colloidal (13 nm), 1 | 3.0 | 100 | 572 | 146 | 1749 |
| 3 | $HIO_3$, 0.1 | IDA, 0.1 | $HNO_3$, 5; HCl, 5 | KOH 13.14 | Colloidal (13 nm), 1 | 3.0 | 53 | 358 | 50.21 | 751 |
| 4 | $HIO_3$, 0.1 | IDA, 1.5 | $H_3PO_4$, 1.5 | KOH 2.079 | Colloidal (13 nm), 1 | 2.7 | 116 | 574 | 772 | 1471 |
| 5 | $HIO_3$, 0.1 | IDA, 1.5 | $HNO_3$, 2 | KOH 3.674 | Colloidal (13 nm), 1 | 3.1 | 149 | 511 | 670 | 2087 |
| 6! | $HIO_3$, 0.1 | IDA, 1.5 | $HNO_3$, 2.31 | NH4OH 2.507 | Colloidal (13 nm), 1 | 3.1 | 130 | 239 | 623 | 2146 |
| 7 | $HIO_3$, 0.1 | IDA, 1.5 | — | KOH, 1.312 | Colloidal (13 nm), 1 | 3.4 | 126 | 1053 | 657 | 1200 |
| 8 | $HIO_3$, 0 | IDA, 2 | — | KOH, 1.305 | Colloidal (13 nm), 1 | 3.5 | 200 | 0 | >3000 | 217 |
| 9 | $HIO_3$, 0.5 | IDA, 1.5 | — | KOH, 1.086 | Colloidal (13 nm), 1 | 3.5 | 120 | 1120 | 731 | 907 |

-continued

| Formula | Oxidizer, % | Copper Inhibitor, % | Copper Activator, % | Neutralizer, % | Abrasive, % | pH | Thermal Oxide RR* | Copper RR* | Tantalum RR | Tantalum Nitride RR |
|---|---|---|---|---|---|---|---|---|---|---|
| 10 | $HIO_3$, 1.5 | IDA, 1.5 | — | KOH, 1.443 | Colloidal (13 nm), 1 | 3.5 | 131 | 1208 | 901 | 856 |

*"RR" means removal rates in Å/min.
Stock Solutions:
$HIO_3$ (50% by weight);
$H_3PO_4$ (85.87% by weight);
KOH (45–46% by weight);
$NH_4OH$ (28–30% by weight);
$HNO_3$ (68–70% by weight);
HCl (36–38% by weight)

As can be seen from Table 3, all of the second slurry formulations of the present invention were effective in achieving acceptable barrier dielectric and copper removal rates, and semiconductor wafer surfaces of high quality.

The first and second slurries described herein, may also be used in a method of chemical mechanical polishing as described above. Also, while this invention has been disclosed and discussed primarily in terms of specific embodiments thereof, it is not intended to be limited thereto. Other modifications and embodiments will be apparent to the worker in the art.

What is claimed is:

1. A method for chemical mechanical polishing copper, barrier material and dielectric material, the method which comprises the steps of:
    providing a first chemical mechanical polishing slurry having a removal rate on copper that is at least 3000 Å/min;
    chemical mechanical polishing a semiconductor wafer surface with said first slurry;
    providing a second chemical mechanical polishing slurry having, a pH in a range of from about 2 to 5, and a removal rate on said barrier material that is greater than 500 Å/min, a removal rate on said copper that is less than or equal to the removal rate of said barrier material and a removal rate on said dielectric material that is less than the removal rate of said barrier material; and
    chemical mechanical polishing said semiconductor wafer surface with said second slurry.

2. The method of claim 1 wherein said first slurry has a copper removal rate of greater than 5000 Å/min and a barrier material removal rate of less than 500 Å/min.

3. The method of claim 1 wherein said first slurry comprises about 1–10% fumed or colloidal silica, 1–12% oxidizing agent; and 0–2% corrosion inhibitor.

4. The method of claim 1 wherein said first slurry comprises from about 1–10% colloidal silica, about 1–12% potassium iodate, about 0–5% concentrated inorganic acid, and about 0–2% iminodiacetic acid.

5. The method of claim 1 wherein said first slurry comprises about 1–5% fumed silica, about 1–12% potassium iodate, about 0–5% concentrated inorganic acid, and about 0–2% iminodiacetic acid.

6. The method of claim 3 wherein said colloidal silica has a particle size of about 3 to 100 nm.

7. The method of claim 3 wherein said fumed silica has a mean particle size of less than about 700 nm.

8. The method of claim 3 wherein said first slurry has a pH in a region of about 2 to 5.

9. The method of claim 4 wherein said first slurry has a pH in a region of about 2 to 5.

10. The method of claim 1 wherein said second slurry has a barrier material removal rate of greater than 1000 Å/min and a copper removal rate of less than 1000 Å/min and dielectric material removal rate of less than 500 Å/min.

11. The method of claim 1 wherein said second slurry comprises about 1–10% colloidal or fumed silica, 0.1–1.0% oxidizing agent; and 0–2% corrosion inhibitor.

12. The method of claim 1 wherein said second slurry comprises about 1–10% colloidal, about 0.1–1% potassium iodate, 0–5% concentrated inorganic acid and about 0–2% iminodiacetic acid.

13. The method of claim 12 wherein said colloidal silica has a particle size of less than about 100 nm.

14. The method of claim 12 wherein said first slurry has a copper removal rate of greater than 5000 Å/min and a barrier material removal rate of less than 500 Å/min and said second slurry has a barrier material removal rate of greater than 1000 Å/min and a copper removal rate of less than 1000 Å/min and a dielectric material removal rate of less than 500 Å/mi.

15. The method of claim 13 wherein said first slurry has a copper removal rate of greater than 5000 Å/min and a barrier material removal rate of less than 500 Å/min and said second slurry has a barrier material removal rate of greater than 1000 Å/min and a copper removal rate of less than 1000 Å/min and a dielectric material removal rate of less than 500 Å/min.

16. A slurry for chemical mechanical polishing copper, barrier material and dielectric material, comprising:
    a first slurry, having a removal rate on copper that is at least 3000 Å/min; and
    a second slurry, having a pH in a range of from about 2 to 5 and a removal rate on said barrier material that is greater than 500 Å/min, a removal rate on copper that is less than or equal to the removal rate of said barrier material and a removal rate on said dielectric material that is less than the removal rate of said barrier material.

17. The chemical mechanical polishing slurry of claim 16, wherein said first slurry comprises:

| | |
|---|---|
| from about 1–10 weight % | fumed or colloidal silica particles |
| from about 1–12 weight % | oxidizing agent; |
| from about 0–2 weight % | corrosion inhibitor; | and said second slurry comprises:

| | |
|---|---|
| from about 1–10 weight % | fumed or colloidal silica particles; |
| from about 0.1–1.0 weight % | oxidizing agent; and |
| from about 0–2 weight % | corrosion inhibitor. |

18. The chemical mechanical polishing slurry of claim 16, wherein said first slurry has a copper removal rate of greater than 5000 Å/min and a barrier material removal rate of less than 500 Å/min.

19. The chemical mechanical polishing slurry of claim 16, wherein said second slurry has a barrier material removal rate of greater than 1000 Å/min and a copper removal rate of less than 1000 Å/min and dielectric material removal rate of less than 500 Å/min.

20. The chemical mechanical polishing slurry of claim 16, wherein said dielectric material is silicon oxide.

21. The chemical mechanical polishing slurry of claim 16, wherein said barrier material is selected from the group consisting of: tungsten nitride, tantalum, tantalum nitride, silicon doped tantalum nitride, titanium nitride and silicon doped titanium nitride.

22. The chemical mechanical polishing slurry of claim 16, wherein said barrier material is tantalum.

23. The chemical mechanical polishing slurry of claim 16, wherein said barrier material is tantalum nitride or silicon doped tantalum nitride.

24. The chemical mechanical polishing slurry of claim 22, wherein said first slurry has a copper removal rate of greater than 5000 Å/min and a tantalum removal rate of less than 500 Å/min, and said second slurry has a tantalum removal rate of greater than 1000 Å/min and a copper removal rate of less than 1000 Å/min and a dielectric material removal rate less than 500 Å/min.

25. The chemical mechanical polishing slurry of claim 16, wherein said first and second slurries are stable and have a pH region of about 2 to 5.

26. The chemical mechanical polishing slurry of claim 16 wherein said first slurry comprises about 1–10% colloidal silica, about 1–12% potassium iodate, about 0–5% concentrated inorganic acid, and about 0–2% iminodiacetic acid.

27. The chemical mechanical polishing slurry of claim 16 wherein said first slurry comprises about 1–5% fumed silica, about 1–12% potassium iodate, about 0–5% concentrated inorganic acid, and about 0–2% iminodiacetic acid.

28. The chemical mechanical polishing slurry of claim 26 wherein said colloidal silica has a particle size of about 3 to 100 nm.

29. The chemical mechanical polishing slurry of claim 27 wherein said fumed silica has a mean particle size of less than 700 nm.

30. The chemical mechanical polishing slurry of claim 26, wherein said first slurry is stable and has a pH in a range of about 2 to 5.

31. The chemical mechanical polishing slurry of claim 27, wherein said first slurry is stable and has a pH in a range of about 2 to 5.

32. The chemical mechanical polishing slurry of claim 16, wherein said second slurry comprises about 1–10% colloidal silica, about 0.1–1% potassium iodate, and about 0–2% iminodiacetic acid and 0–5% concentrated inorganic acid.

33. The chemical mechanical polishing slurry of claim 32, wherein said colloidal silica has a particle size of less than 100 nm.

34. The chemical mechanical polishing slurry of claim 32 wherein said second slurry is stable.

35. The method of claim 8, wherein said first and second slurries further comprise a pH modifier selected from the group consisting of potassium or ammonium hydroxide.

36. The method of claim 9, wherein said first and second slurries further comprise a pH modifier selected from the group consisting of potassium or ammonium hydroxide.

37. The chemical mechanical polishing slurry of claim 16, wherein said first and second slurries further comprise a pH modifier selected from the group consisting of potassium or ammonium hydroxide.

38. The chemical mechanical polishing slurry of claim 30, wherein said first and second slurries further comprise a pH modifier selected from the group consisting of potassium or ammonium hydroxide.

39. The chemical mechanical polishing slurry of claim 31, wherein said first and second slurries further comprise a pH modifier selected from the group consisting of potassium or ammonium hydroxide.

40. The chemical mechanical polishing slurry of claim 32, wherein said first and second slurries further comprise a pH modifier selected from the group consisting of potassium or ammonium hydroxide.

* * * * *